United States Patent
Kato et al.

(10) Patent No.: US 9,148,228 B2
(45) Date of Patent: Sep. 29, 2015

(54) OPTICAL SIGNAL TRANSMITTING DEVICE, OPTICAL SIGNAL TRANSMITTING METHOD, FREQUENCY FLUCTUATION SUPPRESSING DEVICE AND FREQUENCY FLUCTUATION SUPPRESSING SYSTEM

(71) Applicant: FUJITSU LIMITED, Kawasaki-shi, Kanagawa (JP)

(72) Inventors: Tomoyuki Kato, Yokohama (JP); Shigeki Watanabe, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 52 days.

(21) Appl. No.: 13/707,695

(22) Filed: Dec. 7, 2012

(65) Prior Publication Data
US 2013/0223842 A1    Aug. 29, 2013

(30) Foreign Application Priority Data
Feb. 27, 2012   (JP) .................................. 2012-040519

(51) Int. Cl.
*H04B 10/516*   (2013.01)
*H04B 10/2507*   (2013.01)
(Continued)

(52) U.S. Cl.
CPC .......... *H04B 10/516* (2013.01); *H04B 10/2507* (2013.01); *H04B 10/504* (2013.01); *H04J 14/02* (2013.01); *H04J 14/0298* (2013.01); *H01S 5/0092* (2013.01); *H01S 5/4087* (2013.01)

(58) Field of Classification Search
USPC .............. 398/186, 198, 183, 182, 1; 359/238, 359/334
See application file for complete search history.

(56) References Cited

U.S. PATENT DOCUMENTS 6,608,854 B1 * 8/2003 Watanabe ........................ 372/96
7,271,948 B1 * 9/2007 Wang et al. .................... 359/334
(Continued)

FOREIGN PATENT DOCUMENTS

EP    0 503 512 A2    9/1992
EP    1 041 749 A1    10/2000
(Continued)

OTHER PUBLICATIONS

Extended European Search Report issued Jul. 10, 2013 in European Application No. 12196465.4-1860.

*Primary Examiner* — David Payne
*Assistant Examiner* — Omar S Ismail
(74) *Attorney, Agent, or Firm* — Staas & Halsey LLP

(57) ABSTRACT

An optical signal transmitting device includes direct modulators configured to be driven using electric signals of channels to generate directly-modulated optical signals of channels, a beat light source configured to generate beat light at a specific frequency spacing, subcarrier converters configured to modulate, using the beat light from the beat light source, the directly-modulated optical signals of the channels from the direct modulators to generate optical subcarrier modulation signals of channels, probe light sources configured to generate probe light of channels having frequencies that are different from frequencies of the directly-modulated optical signals of the channels, multiplexers configured to multiplex, for individual channels, the optical subcarrier modulation signals of the channels with the probe light of the channels, and nonlinear optical media configured to perform, for individual channels, optical cross modulation for the optical subcarrier modulation signals and the probe light, which are multiplexed, and transmit processed signals.

8 Claims, 9 Drawing Sheets

(51) Int. Cl.
 *H04B 10/50* (2013.01)
 *H04J 14/02* (2006.01)
 *H01S 5/00* (2006.01)
 *H01S 5/40* (2006.01)

(56) References Cited

U.S. PATENT DOCUMENTS

| | | | |
|---|---|---|---|
| 2003/0030868 A1* | 2/2003 | Sasai et al. | 359/154 |
| 2004/0091204 A1* | 5/2004 | Islam | 385/24 |
| 2004/0156644 A1* | 8/2004 | Yasue et al. | 398/198 |
| 2009/0208200 A1* | 8/2009 | Takasaka et al. | 398/1 |
| 2010/0220376 A1* | 9/2010 | Kobayashi et al. | 359/238 |
| 2011/0176202 A1* | 7/2011 | Kato et al. | 359/337.5 |
| 2011/0229138 A1* | 9/2011 | Watanabe | 398/79 |

FOREIGN PATENT DOCUMENTS

| | | |
|---|---|---|
| EP | 1 806 617 A1 | 7/2007 |
| JP | 2011-215603 | 10/2011 |
| WO | WO 99/07087 | 2/1999 |

\* cited by examiner

OPTICAL SIGNAL TRANSMITTING DEVICE, OPTICAL SIGNAL TRANSMITTING METHOD, FREQUENCY FLUCTUATION SUPPRESSING DEVICE AND FREQUENCY FLUCTUATION SUPPRESSING SYSTEM

CROSS-REFERENCE TO RELATED APPLICATION

This application is based upon and claims the benefit of priority of the prior Japanese Patent Application No. 2012-040519, filed on Feb. 27, 2012, the entire contents of which are incorporated herein by reference.

FIELD

The embodiments discussed herein are related to optical signal transmitting devices, optical signal transmitting methods, frequency fluctuation suppressing devices and frequency fluctuation suppressing systems.

BACKGROUND

A direct modulation technique for driving a laser diode using an electric signal to generate an optical signal is available as an optical signal transmission technique. Direct modulation using laser diodes can generate optical signals with a simple configuration and is thus advantageous in reducing the cost of an optical communication system. Thus, direct modulation using laser diodes is used for short-range optical transmission systems. However, in the case of direct modulation using laser diodes, it is difficult to extend the transmission range. In long-range optical transmission systems, with the use of an external optical modulator, optical signals with a higher quality are generated. However, since such a configuration includes complicated and expensive components, the cost is not reduced.

A carrier signal from an oscillator is modulated using a data signal B by a multiplier, and an optical modulator outputs control light ECt, which is obtained by being modulated using the carrier signal modulated using the data signal B. A multiplexer multiplexes carrier light ES, which is continuous wave (CW) light, with the control light ECt from the optical modulator, and a nonlinear optical medium performs cross-phase modulation for the carrier light ES on the basis of the control light ECt. This technology is disclosed, for example, in Japanese Laid-open Patent Publication No. 2001-215603.

In direct modulation using laser diodes, a frequency chirp, which is a change in the emission light frequency based on the intensity of a driven electric signal, occurs. Thus, the waveform of a direct-modulated optical signal is degraded in a transmission path, and the transmission range is restricted.

In order to suppress the degradation in the waveform, trials have been conducted to extend the transmission range by applying pre-emphasis on driven electric signals and performing signal processing for received electric signals. However, there is a problem in that power consumption increases.

Furthermore, although optical signals generated using an external modulator can be transmitted over a long range, the driving voltage amplitude is higher than that for optical signals generated by direct modulation. In addition, since the insertion loss of the external modulator is large, electrical and optical amplifiers are provided, and this configuration increases the cost.

SUMMARY

According to an aspect of the embodiments, an optical signal transmitting device includes direct modulators configured to be driven using electric signals of channels to generate directly-modulated optical signals of channels, a beat light source configured to generate beat light at a specific frequency spacing, subcarrier converters configured to modulate, using the beat light from the beat light source, the directly-modulated optical signals of the channels from the direct modulators to generate optical subcarrier modulation signals of channels, probe light sources configured to generate probe light of channels having frequencies that are different from frequencies of the directly-modulated optical signals of the channels, multiplexers configured to multiplex, for individual channels, the optical subcarrier modulation signals of the channels with the probe light of the channels, and nonlinear optical media configured to perform, for individual channels, optical cross modulation for the optical subcarrier modulation signals and the probe light, which are multiplexed, and transmit processed signals.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments will be described with reference to the drawings.

Overview

Figure 1:
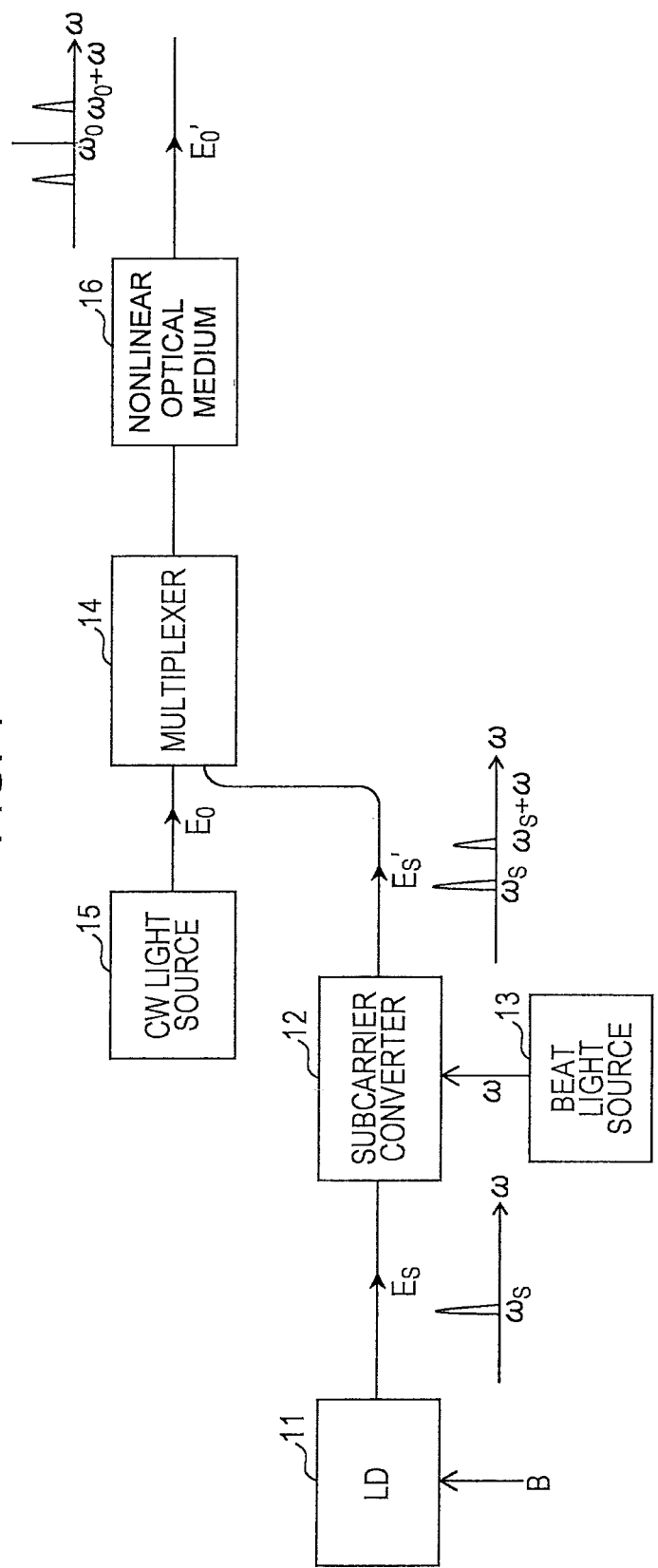
FIG. 1 is a block diagram for explaining the overview of an optical signal transmitting device.

FIG. 1 is a block diagram for explaining the overview of an optical signal transmitting device. Referring to FIG. 1, a directly-modulated optical signal $E_S$ output from a laser diode (LD) 11 can be represented by equation (1).

$$E_S(t) = B(t)\exp[j(\omega_S + \Delta\omega\{B(t)\})t] \quad (1),$$

where "B(t)" represents a modulation electric signal, "$\omega_S$" represents an initial oscillation light frequency, "$\Delta\omega$" represents a frequency chirp. The optical power of the directly-modulated optical signal $E_S$, $P_S = |E_S|^2$, is represented by equation (2).

$$P_S = B(t)^2 \quad (2).$$

In the case of transmission through a transmission path without a chromatic dispersion, signals are not degraded by a frequency chirp as shown in equation (2). However, in the case of transmission through a transmission path exhibiting a chromatic dispersion, the waveform of the directly-modulated optical signal $E_S$ is significantly degraded by the chromatic dispersion, which is based on the intensity of a modulation optical signal.

By performing optical cross-intensity modulation (also referred to as cross-gain modulation) for probe light using the directly-modulated optical signal $E_S$, the probe light is modulated to an optical signal having no frequency chirp. However, since optical cross-intensity modulation at a high degree of modulation uses high optical power, an optical amplifier is provided. Thus, the cost is not reduced.

Here, optical cross-phase modulation (XPM) using an optical subcarrier modulation signal, which can modulate an optical signal with a low optical power, is used. A subcarrier converter 12 modulates, using beat light $E_b$ at a frequency spacing ω supplied from a beat light source 13, the directly-modulated optical signal $E_S$. Accordingly, an optical subcarrier modulation signal $E_S'$, which is represented by equation (3), is obtained.

$$E_S'(t)=S_0B(t)\exp[j(\omega_S+\Delta\omega\{B(t)\})t]+S_1B(t)\exp[j(\omega_S+\omega+\Delta\omega\{B(t)\})t] \quad (3)$$

where "$S_0$" represents the intensity of an optical subcarrier of the zeroth order and "$S_1$" represents the intensity of an optical subcarrier of the first order. The optical power $P_S'=|E_S'|^2$ of the optical subcarrier modulation signal $E_S'$ is represented by equation (4).

$$P_S'(t)=B(t)^2[S_0^2+S_1^2+2S_0S_1\cos(\omega t)] \quad (4)$$

As is clear from equation (4), in the optical power, a frequency chirp component Δω[B(t)] is removed. The optical subcarrier modulation signal $E_S'$ is supplied to a multiplexer 14 so as to be multiplexed with probe light $E_0$, which is CW light at an optical frequency $\omega_0$ supplied from a CW light source 15, and the multiplexed signal passes through a nonlinear optical medium 16 and is subjected to cross-phase modulation. An optical signal output from the nonlinear optical medium 16 is represented by equation (5).

$$E_0'(t) = E_0\exp[j\omega_0 t + jm\cos(\omega t)] \quad (5)$$
$$= E_0J_0(m)\exp(j\omega_0 t) + E_0J_1(m)\exp[j(\omega_0+\omega)t] -$$
$$E_0J_1(m)\exp[j(\omega_0-\omega)t],$$

where m is represented by equation: $m=2\eta B(t)^2S_0S_1(t)$, "$J_0$" represents a zeroth-order Bessel function of the first kind, "$J_1$" represents a first-order Bessel function of the first kind, and "η" represents a modulation efficiency. Here, since "m" is regarded as being sufficiently small, the terms of the second and higher orders are ignored. The first-order component of the output optical signal, that is, the second term and the third term of the right side of equation (5), each have a modulation signal component B(t) and do not have a frequency chirp.

As a configuration for driving the laser diode 11 using an electric signal obtained by multiplying a modulation electric signal B(t) and an electric signal having a frequency ω, the subcarrier converter 12 does not have to be provided.

In FIG. 1, the subcarrier converter 12 is newly provided. This configuration is redundant for the subcarrier conversion to be performed for a single directly-modulated optical signal. However, subcarrier conversion of a plurality of directly-modulated optical signals can be performed collectively, and a large number of optical signals having no frequency chirp can be collectively generated from a large number of directly-modulated optical signals.

Figure 2:
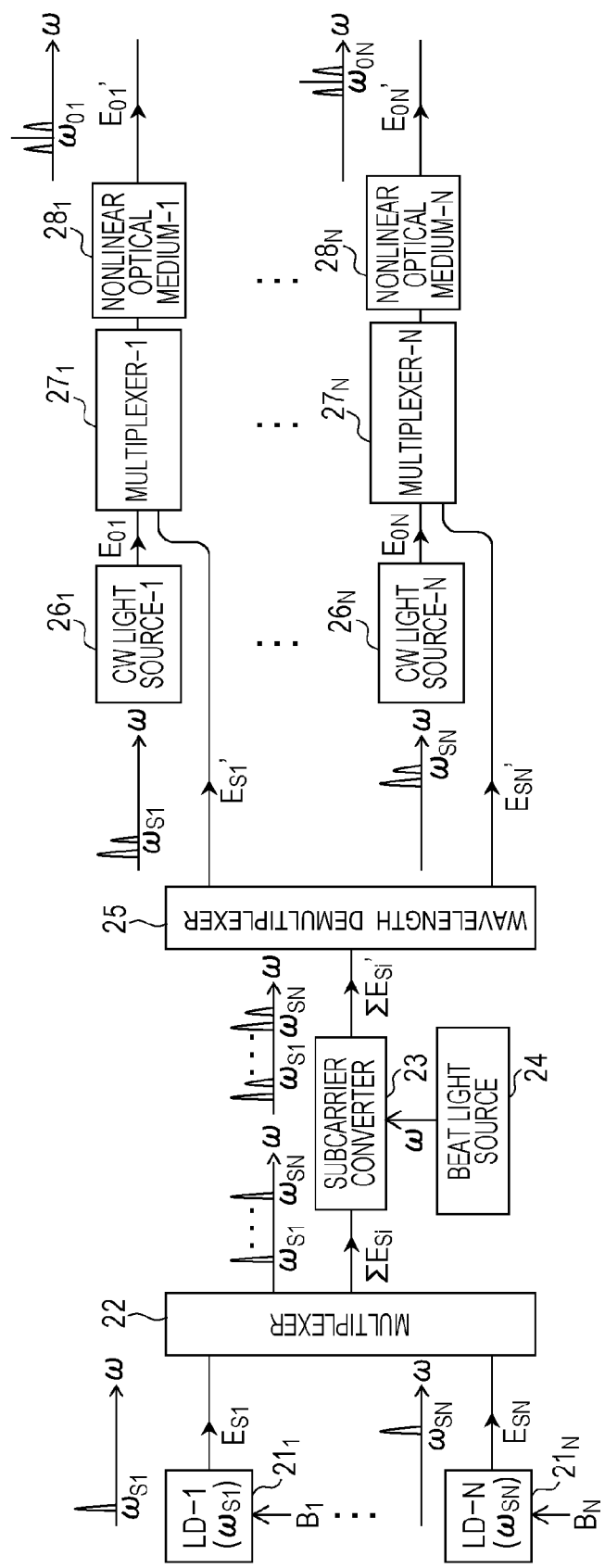
FIG. 2 is a block diagram of an optical signal transmitting device according to a first embodiment.

FIG. 2 is a block diagram of an optical signal transmitting device according to a first embodiment. Referring to FIG. 2, the optical signal transmitting device includes N laser diodes $21_1$ to $21_N$ serving as sources of directly-modulated optical signals, a multiplexer 22, an optical subcarrier converter 23, a beat light source 24, a wavelength demultiplexer 25, N CW light sources $26_1$ to $26_N$, N multiplexers $27_1$ to $27_N$, and N nonlinear optical media $28_1$ to $28_N$.

For example, N-channel modulation electric signals $B_1$ to $B_N$, which are digital data, are supplied to the N laser diodes $21_1$ to $21_N$. The laser diodes $21_1$ to $21_N$ output N-channel directly-modulated optical signals $E_{Si}$ ("i" represents an integer of 1 to N) having different oscillation light frequencies $\omega_{Si}$. The N-channel directly-modulated optical signals $E_{Si}$ are supplied to the multiplexer 22 and are multiplexed.

The multiplexed directly-modulated optical signal $\Sigma E_{Si}'$ is supplied to the optical subcarrier converter 23 and is modulated using beat light $E_b$ at a frequency spacing ω supplied from the beat light source 24, and an N-channel optical subcarrier modulation signal $\Sigma E_{Si}'$ at a subcarrier frequency ω is collectively generated. The N-channel optical subcarrier modulation signal $\Sigma E_{Si}'$ is demultiplexed by the wavelength demultiplexer 25 for individual channels, and N-channel optical subcarrier modulation signals $E_{Si}'$ (=$E_{S1}'$ to $E_{SN}'$) are obtained. The N-channel optical subcarrier modulation signals $E_{Si}'$ are supplied to the multiplexers $27_1$ to $27_N$.

N-channel probe light $E_{0i}$ (=$E_{01}$ to $E_{0N}$) having optical frequencies $\omega_{01}$ to $\omega_{0N}$, which are different from the frequencies of the directly-modulated optical signals $E_{Si}$, are supplied from the CW light sources $26_1$ to $26_N$ to the multiplexers $27_1$ to $27_N$. The multiplexers $27_1$ to $27_N$ multiplex the optical subcarrier modulation signals $E_{Si}'$ with the probe light $E_{0i}$, and supply the multiplexed signals to the nonlinear optical media $28_1$ to $28_N$. The nonlinear optical media $28_1$ to $28_N$ perform cross-phase modulation for the optical subcarrier modulation signals $E_{Si}'$ and the probe light $E_{0i}$, which are multiplexed, to generate N-channel optical signals $E_{0i}'$ having no frequency chirp.

The N-channel optical signals $E_{0i}'$ are transmitted to different transmission paths.

Alternatively, N-channel optical signals $E_{0i}'$ having no frequency chirp may be multiplexed and be transmitted as a wavelength division multiplexing (WDM) signal to a single transmission path.

The laser diodes $21_1$ to $21_N$ are driven by directly-modulated using electric signals. The laser diodes $21_1$ to $21_N$ do not have to produce single longitudinal mode oscillation. The laser diodes $21_1$ to $21_N$ may be Fabry-Perot lasers, light-emitting diodes (LEDs), or the like, which produce multi-longitudinal mode oscillation.

The optical subcarrier modulation signals $E_{Si}'$ output from the optical subcarrier converter 23 may be controlled to have the same polarization as that of the probe light $E_{0i}$ and be multiplexed with the probe light $E_{0i}$. For example, a polarization controller may be provided between the optical subcarrier converter 23 and the multiplexers $27_1$ to $27_N$ or between the CW light sources $26_1$ to $26_N$ and the multiplexers $27_1$ to $27_N$. Accordingly, in the nonlinear optical media, high-efficiency optical cross modulation can be achieved.

Figure 3:
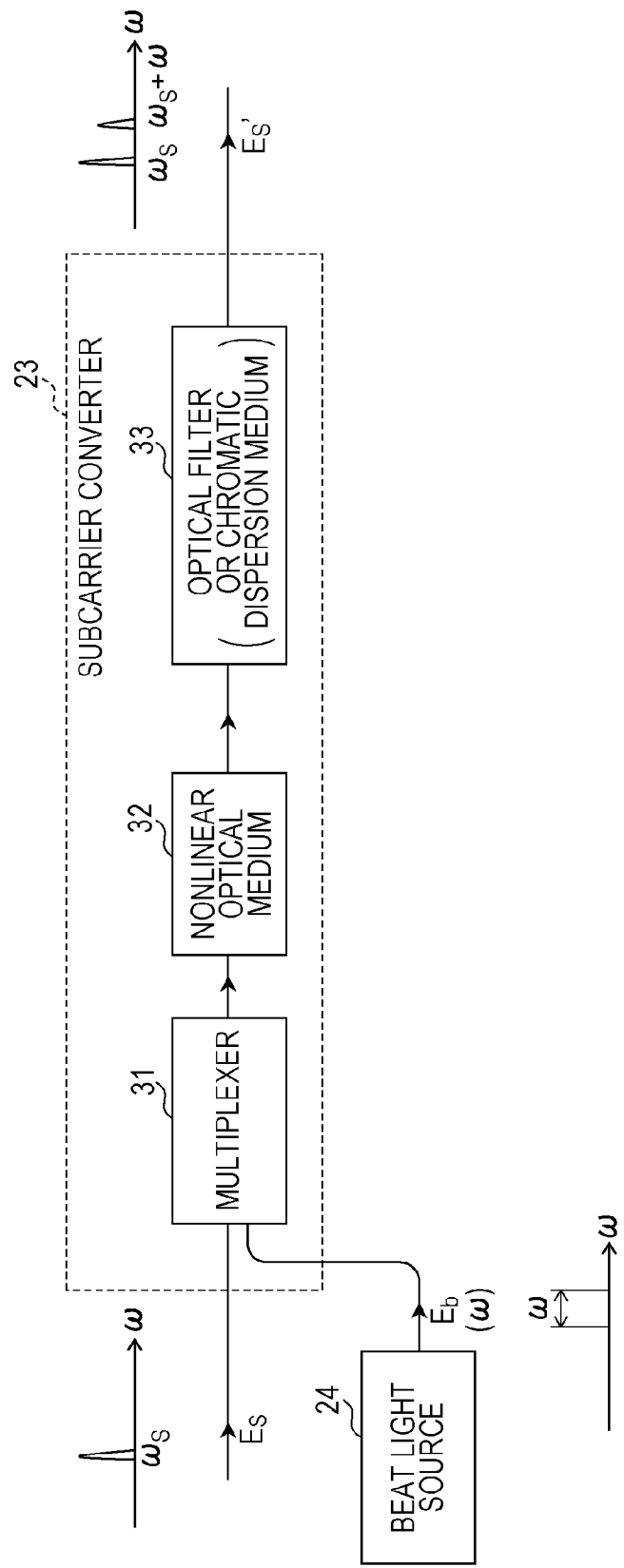
FIG. 3 is a block diagram of an optical subcarrier converter used in the first embodiment.

FIG. 3 is a block diagram of the optical subcarrier converter 23 used in the first embodiment. Referring to FIG. 3, the optical subcarrier converter 23 includes a multiplexer 31, a nonlinear optical medium 32, and an optical filter (or dispersion medium) 33.

A directly-modulated optical signal $E_S$ having a frequency $\omega_S$ included in the directly-modulated optical signal $\Sigma E_{Si}$ will be explained as an example. The multiplexer 31 multiplexes the directly-modulated optical signal $E_S$ with beat light $E_b$ from the beat light source 24. The beat light $E_b$ has an optical frequency that is different from the frequency of the directly-modulated optical signal $E_S$ and includes two or more optical signals at a frequency spacing $\omega$. An optical signal output from the multiplexer 31 passes through the nonlinear optical medium 32, and the directly-modulated optical signal $E_S$ is subjected to cross modulation using the beat light $E_b$. The cross-phase modulated optical subcarrier modulation signal $E_S'$ passes through the optical filter 33, and a zeroth-order modulation component $\omega_S$ and a first-order modulation component $\omega_S+\omega$ are extracted and output as an intensity-modulated optical subcarrier modulation signal.

The beat light source 24 multiplexes, with a multiplexer, light at a frequency spacing $\omega$ output from two CW light sources to generate beat light $E_b$. Alternatively, the beat light source 24 may be an optical comb light source at a frequency spacing $\omega$. Alternatively, output from one CW light source may be electrically-optically intensity modulated at a frequency $\omega$ using an electrical-optical intensity modulator.

Optical phase modulation based on cross-phase modulation, optical cross-gain modulation, optical intensity modulation based on switching employing an optical parametric amplification effect or an optical Kerr effect, or the like may be used as optical cross modulation by the nonlinear optical medium 32. For example, an optical fiber, a periodically poled lithium niobate, a semiconductor optical amplifier, or a high refractive index difference optical waveguide, such as a silicon fine wire waveguide, may be used as a nonlinear optical medium. The same as the nonlinear optical medium 32 is applied to each of the nonlinear optical media $28_1$ to $28_N$.

By transmission through a dispersion medium instead of the optical filter 33, an intensity-modulated optical subcarrier modulation signal can be obtained. The dispersion medium is a chromatic dispersion medium which provides different group delays to both side-bands of a subcarrier modulation signal component. The dispersion medium is, for example, an optical fiber, a virtually imaged phase array (VIPA), a fiber Bragg grating (FBG), or the like. The dispersion medium is a birefringent medium which provides different group delays to two different polarization components of input signal light. The dispersion medium is, for example, a polarization maintaining fiber, an optical waveguide having a configuration which is not uniform in the circumferential direction of optical field distribution, a double refraction optical crystal, or a double refraction medium employing the optical Kerr effect based on a nonlinear optical medium. Furthermore, the dispersion medium is a multimode waveguide which converts input signal light into different propagation modes and provides different group delays to the individual propagation modes. The dispersion medium is, for example, a multimode fiber, a planar lightwave circuit (PLC), a multimode optical waveguide, such as a high refractive index difference waveguide, or the like. Furthermore, the dispersion medium is an interferometer which splits input signal light into two paths and provides different optical delay times to the individual paths. The dispersion medium is, for example, a Mach-Zehnder interferometer, a nonlinear loop mirror, or the like.

Figure 4:
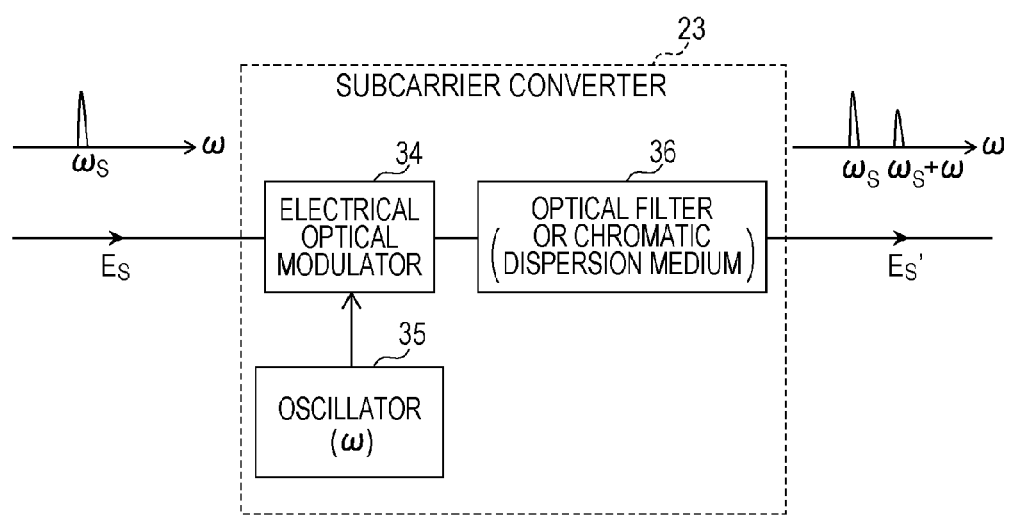
FIG. 4 is a block diagram of an optical subcarrier converter used in a second embodiment.

FIG. 4 is a block diagram of the optical subcarrier converter 23 used in a second embodiment. Referring to FIG. 4, the optical subcarrier converter 23 includes an electrical-optical modulator 34, an oscillator 35, and an optical filter (or a dispersion medium) 36.

A directly-modulated optical signal $E_S$ having a frequency $\omega_S$ included in the directly-modulated optical signal $\Sigma E_{Si}$ will be explained as an example. The directly-modulated optical signal $E_S$ is supplied to the electrical-optical modulator 34. The electrical-optical modulator 34 performs, using an electric signal having an oscillation frequency $\omega$ supplied from the oscillator 35, phase modulation for the directly-modulated optical signal $E_S$ to obtain an optical subcarrier modulation signal. The phase-modulated optical subcarrier modulation signal passes through the optical filter 36, and a zeroth-order modulation component $\omega_S$ and a first-order modulation component $\omega_S+\omega$ are extracted and are converted into an intensity-modulated optical subcarrier modulation signal. Alternatively, the phase-modulated optical subcarrier modulation signal may be converted, using a dispersion medium instead of the optical filter 36, into an intensity-modulated optical subcarrier modulation signal.

The electrical-optical modulator 34 may be configured to perform, using the electric signal having the frequency $\omega$ supplied from the oscillator 35, intensity modulation for the directly-modulated optical signal $E_S$ to obtain an optical subcarrier modulation signal. The electrical-optical modulator 34 may be a lithium niobate electrical-optical intensity modulator, a lithium niobate electrical-optical phase modulator, a semiconductor electrical-optical intensity modulator, an electrical-optical phase modulator, or an electric field absorption (EA) modulator, or the like.

Figure 5:
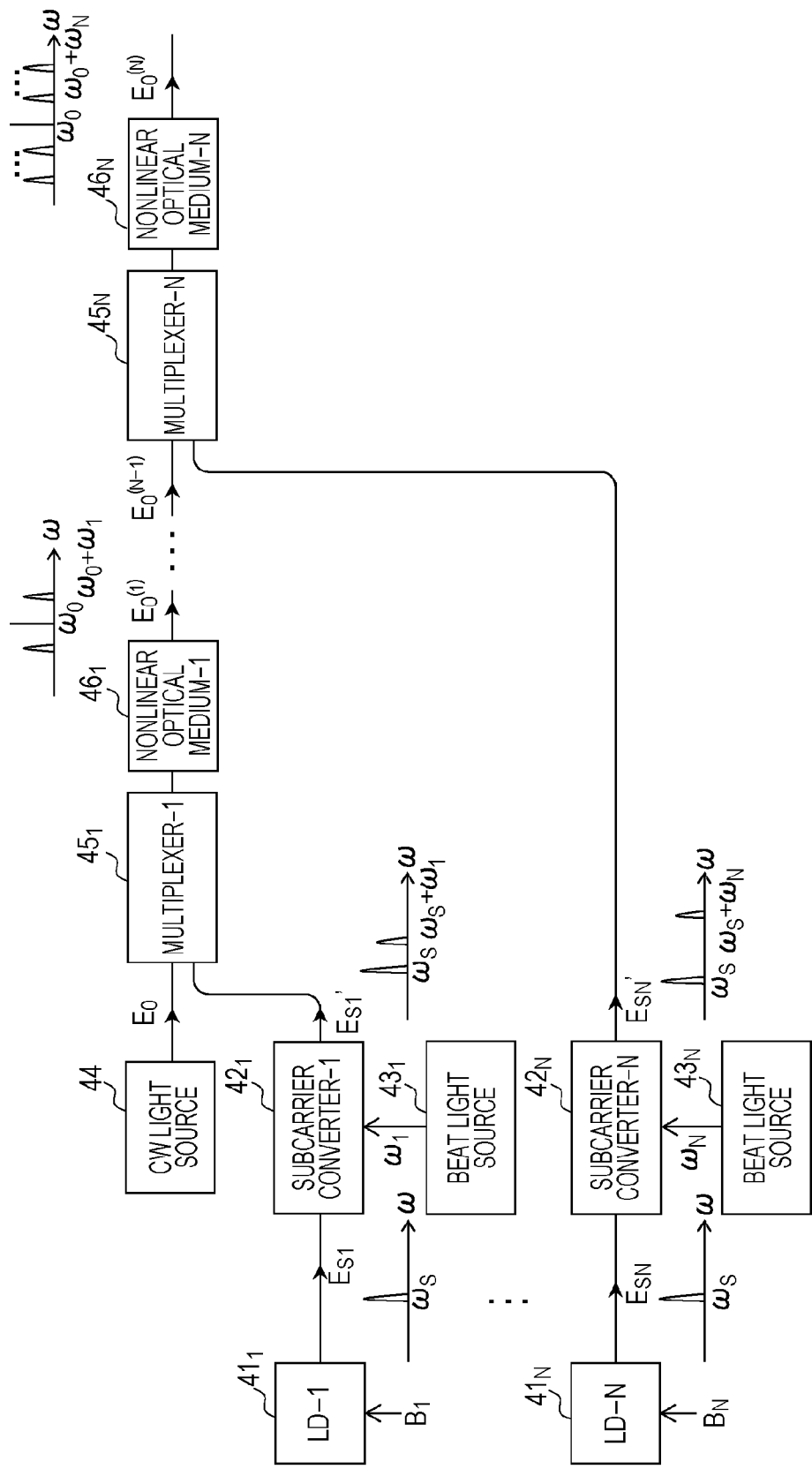
FIG. 5 is a block diagram of an optical signal transmitting device according to the second embodiment.

FIG. 5 is a block diagram of an optical signal transmitting device according to the second embodiment. Referring to FIG. 5, the optical signal transmitting device includes N laser diodes $41_1$ to $41_N$ serving as sources of directly-modulated optical signals, N optical subcarrier converters $42_1$ to $42_N$, N beat light sources $43_1$ to $43_N$, a CW light source 44, N multiplexers $45_1$ to $45_N$, and N nonlinear optical media $46_1$ to $46_N$.

Electric signals $B_1$ to $B_N$ are supplied to the N laser diodes $41_1$ to $41_N$. The laser diodes $41_1$ to $41_N$ output N-channel directly-modulated optical signals $E_{Si}$ (i represents an integer of 1 to N) having oscillation light frequencies $\omega_{Si}$. The directly-modulated optical signals $E_{Si}$ are supplied to the optical subcarrier converters $42_1$ to $42_N$ and are modulated using beat light $E_{b1}$ to $E_{bN}$ at different frequency spacings $\omega_1$ to $\omega_N$ supplied from the beat light sources $43_1$ to $43_N$. Accordingly, N-channel optical subcarrier modulation signals $E_{S1}'$ to $E_{SN}'$ are generated and are supplied to the multiplexers $45_1$ to $45_N$. The optical subcarrier converters $42_1$ to $42_N$ each have a configuration similar to the optical subcarrier converter 23, as illustrated in FIG. 3 or FIG. 4.

Single-channel probe light $E_0$ having an optical frequency $\omega_0$, which is different from the frequencies of the directly-modulated optical signals $E_{Si}$, is supplied from the CW light source 44 to the multiplexer $45_1$. The multiplexer $45_1$ multiplexes the optical subcarrier modulation signal $E_{S1}'$ with the probe light $E_0$, and supplies the multiplexed signal to the nonlinear optical medium $46_1$. The nonlinear optical medium $46_1$ performs cross-phase modulation for the optical subcarrier modulation signal $E_{s1}'$ and the probe light $E_0$ to generate an optical signal $E_0^{(1)}$ having no frequency chirp, and supplies the generated optical signal $E_0^{(1)}$ to the multiplexer $45_2$ in the next stage. The multiplexer $45_2$ multiplexes the optical subcarrier modulation signal $E_{S2}'$ with the probe light $E_0$, and supplies the multiplexed signal to the nonlinear optical medium $46_2$. The nonlinear optical medium $46_2$ performs cross-phase modulation for the optical subcarrier modulation signal $E_{S2}'$ and the probe light $E_0$ to generate an optical signal $E_0^{(2)}$ having no frequency chirp, and supplies the generated optical signal $E_0^{(2)}$ to the multiplexer $45_3$ in the next stage. Similarly, the multiplexers $45_3$ to $45_N$ and the nonlinear optical media $46_3$ to $46_N$ generate optical signals $E_0^{(3)}$ to $E_0^{(N)}$ having no frequency chirp. The optical signals $E_0^{(1)}$ to $E_0^{(N)}$ having no frequency chirp generated as described above are transmitted from the nonlinear optical medium $46_N$ to a transmission path.

The oscillation light frequencies $\omega_{Si}$ of the laser diodes $41_1$ to $41_N$ may be the same or differ from each other.

Figure 6:
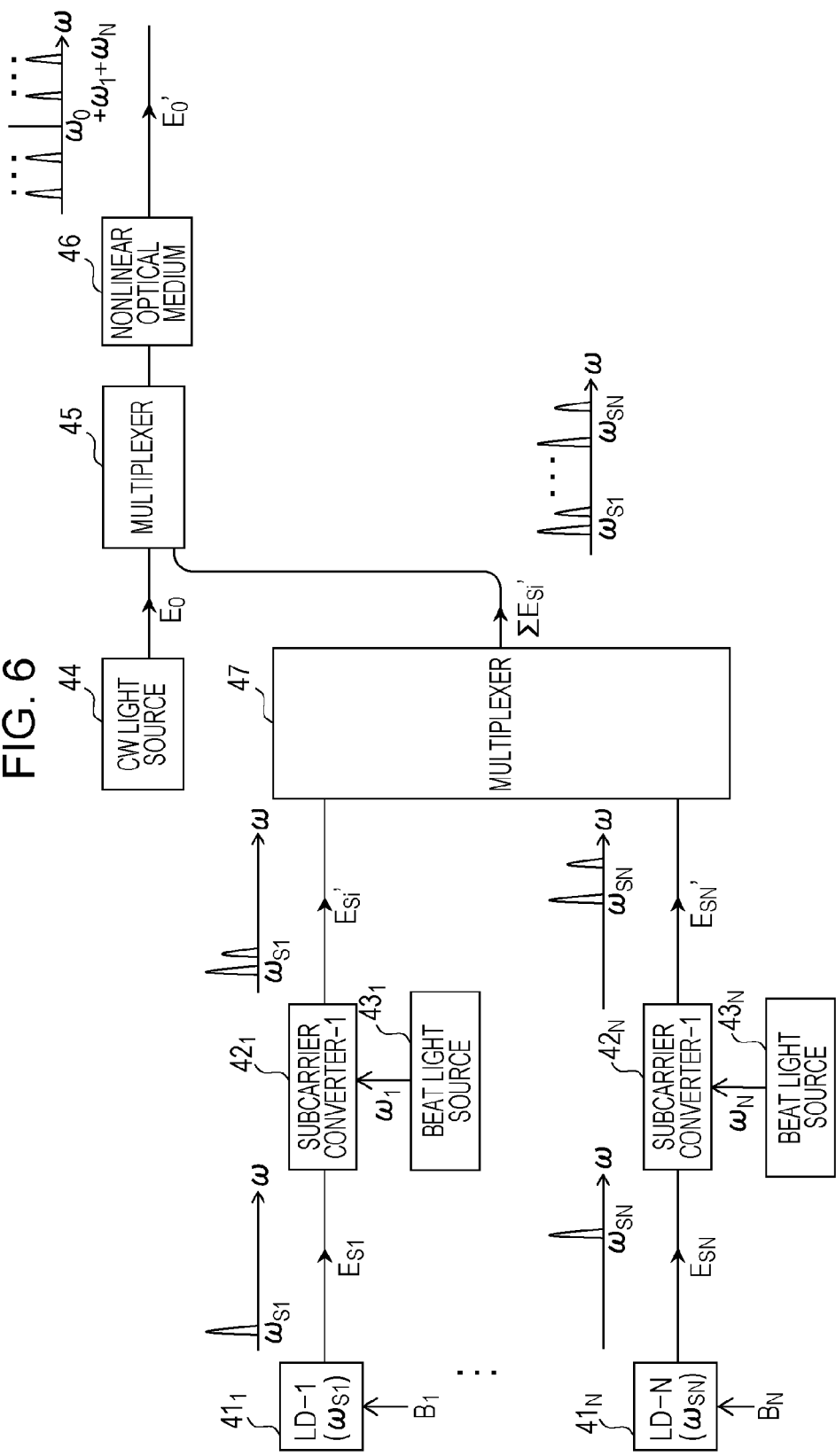
FIG. 6 is a block diagram of an optical signal transmitting device according to a third embodiment.

FIG. 6 is a block diagram of an optical signal transmitting device according to a third embodiment. Referring to FIG. 6, the optical signal transmitting device includes N laser diodes $41_1$ to $41_N$ serving as sources of directly-modulated optical signals, optical subcarrier converters $42_1$ to $42_N$, N beat light sources $43_1$ to $43_N$, a CW light source 44, a multiplexer 45, a nonlinear optical medium 46, and a multiplexer 47.

Electric signals $B_1$ to $B_N$ are supplied to the N laser diodes $41_1$ to $41_N$. The laser diodes $41_1$ to $41_N$ output N-channel directly-modulated optical signals $E_{Si}$ (i represents an integer of 1 to N) having different oscillation light frequencies $\omega_{Si}$. The directly-modulated optical signals $E_{Si}$ are supplied to the optical subcarrier converters $42_1$ to $42_N$ and are modulated using beat light $E_{b1}$ to $E_{bN}$ at different frequency spacings $\omega_1$ to $\omega_N$ supplied from the beat light sources $43_1$ to $43_N$. Accordingly, N-channel optical subcarrier modulation signals $E_{S1}'$ to $E_{SN}'$ are generated. The N-channel optical subcarrier modulation signals $E_{S1}'$ to $E_{SN}'$ are multiplexed by the multiplexer 47 and the multiplexed signal is supplied to the multiplexer 45. The optical subcarrier converters $42_1$ to $42_N$ each have a configuration similar to the optical subcarrier converter 23, as illustrated in FIG. 3 or FIG. 4.

Probe light $E_0$ having an optical frequency $\omega_0$, which is different from the frequencies of the directly-modulated optical signals $E_{Si}$, is supplied from the CW light source 44 to the multiplexer 45. The optical subcarrier modulation signals $E_{S1}'$ to $E_{SN}'$ and the probe light $E_0$ are multiplexed by the multiplexer 45 and are supplied to the nonlinear optical medium 46. The multiplexer 45 and the multiplexer 47 may be integrated together so that the N-channel optical subcarrier modulation signals $E_{S1}'$ to $E_{SN}'$ and the probe light $E_0$ can be multiplexed by a single multiplexer.

The nonlinear optical medium 46 performs cross-phase modulation for the optical subcarrier modulation signals $E_{S1}'$ to $E_{SN}'$ and the probe light $E_0$ to generate an optical signal $E_0'$ having no frequency chirp. The optical signal $E_0'$ having no frequency chirp generated as described above is transmitted from the nonlinear optical medium 46 to a transmission path.

Figure 7:
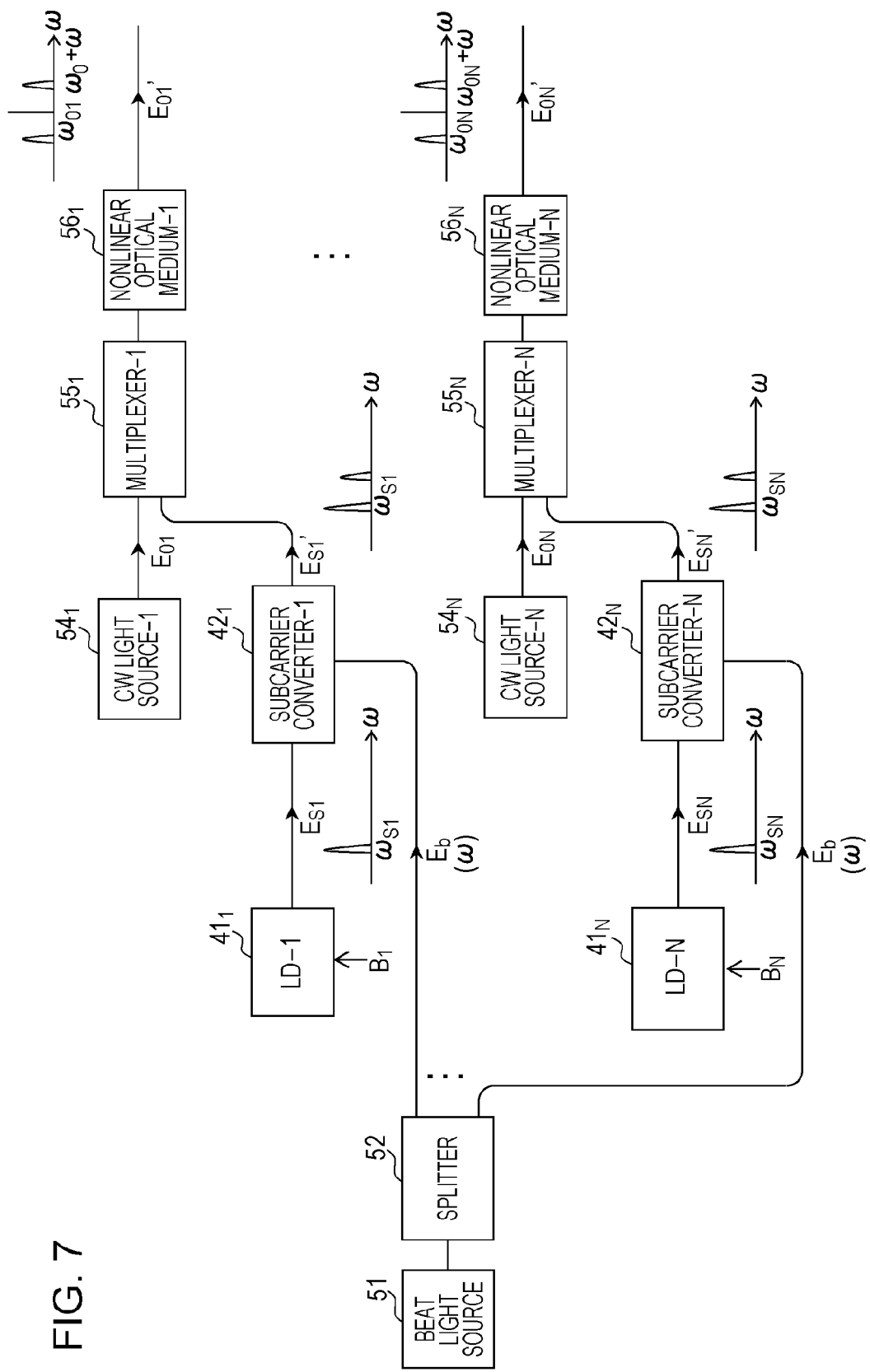
FIG. 7 is a block diagram of an optical signal transmitting device according to a fourth embodiment.

FIG. 7 is a block diagram of an optical signal transmitting device according to a fourth embodiment. Referring to FIG. 7, the optical signal transmitting device includes N laser diodes $41_1$ to $41_N$ serving as sources of directly-modulated optical signals, optical subcarrier converters $42_1$ to $42_N$, a beat light source 51, a splitter 52, CW light sources $54_1$ to $54_N$, multiplexers $55_1$ to $55_N$, and nonlinear optical media $56_1$ to $56_N$.

Electric signals $B_1$ to $B_N$ are supplied to the N laser diodes $41_1$ to $41_N$. The laser diodes $41_1$ to $41_N$ output N-channel directly-modulated optical signals $E_{Si}$ (i represents an integer of 1 to N) having oscillation light frequencies $\omega_{Si}$. The directly-modulated optical signals $E_{Si}$ are supplied to the optical subcarrier converters $42_1$ to $42_N$. Beat light $E_b$ at a frequency spacing co is generated by the beat light source 51 and is split into N pieces by the splitter 52. The N pieces of beat light Eb are supplied to the optical subcarrier converters $42_1$ to $42_N$. The optical subcarrier converters $42_1$ to $42_N$ modulate the directly-modulated optical signals $E_{Si}$ using the beat light $E_b$ to generate N-channel optical subcarrier modulation signals $E_{S1}'$ to $E_{SN}'$. The optical subcarrier modulation signals $E_{S1}'$ to $E_{SN}'$ are supplied to the multiplexers $55_1$ to $55_N$. The optical subcarrier converters $42_1$ to $42_N$ each have a configuration similar to the optical subcarrier converter 23, as illustrated in FIG. 3 or FIG. 4.

N-channel probe light $E_{01}$ to $E_{0N}$ having optical frequencies $\omega_{01}$ to $\omega_{0N}$ that are different from the frequencies of the directly-modulated optical signals $E_{Si}$ are supplied from the CW light sources $54_1$ to $54_N$ to the multiplexers $55_1$ to $55_N$. The optical subcarrier modulation signals $E_{S1}'$ to $E_{SN}'$ and the probe light $E_{01}$ to $E_{0N}$ are multiplexed by the multiplexers $55_1$ to $55_N$ and are supplied to the nonlinear optical media $56_1$ to $56_N$. The nonlinear optical media $56_1$ to $56_N$ perform cross-phase modulation for the optical subcarrier modulation signals $E_{S1}'$ to $E_{SN}'$ and the probe light $E_{01}$ to $E_{0N}$ to generate optical signals $E_{01}'$ to $E_{0N}'$ having no frequency chirp. The optical signals $E_{01}'$ to $E_{0N}'$ having no frequency chirp generated as described above are transmitted from the nonlinear optical media $56_1$ to $56_N$ to transmission paths.

Alternatively, N-channel optical signals $E_{01}'$ having no frequency chirp may be multiplexed and be transmitted as a WDM signal to a single transmission path.

Figure 8:
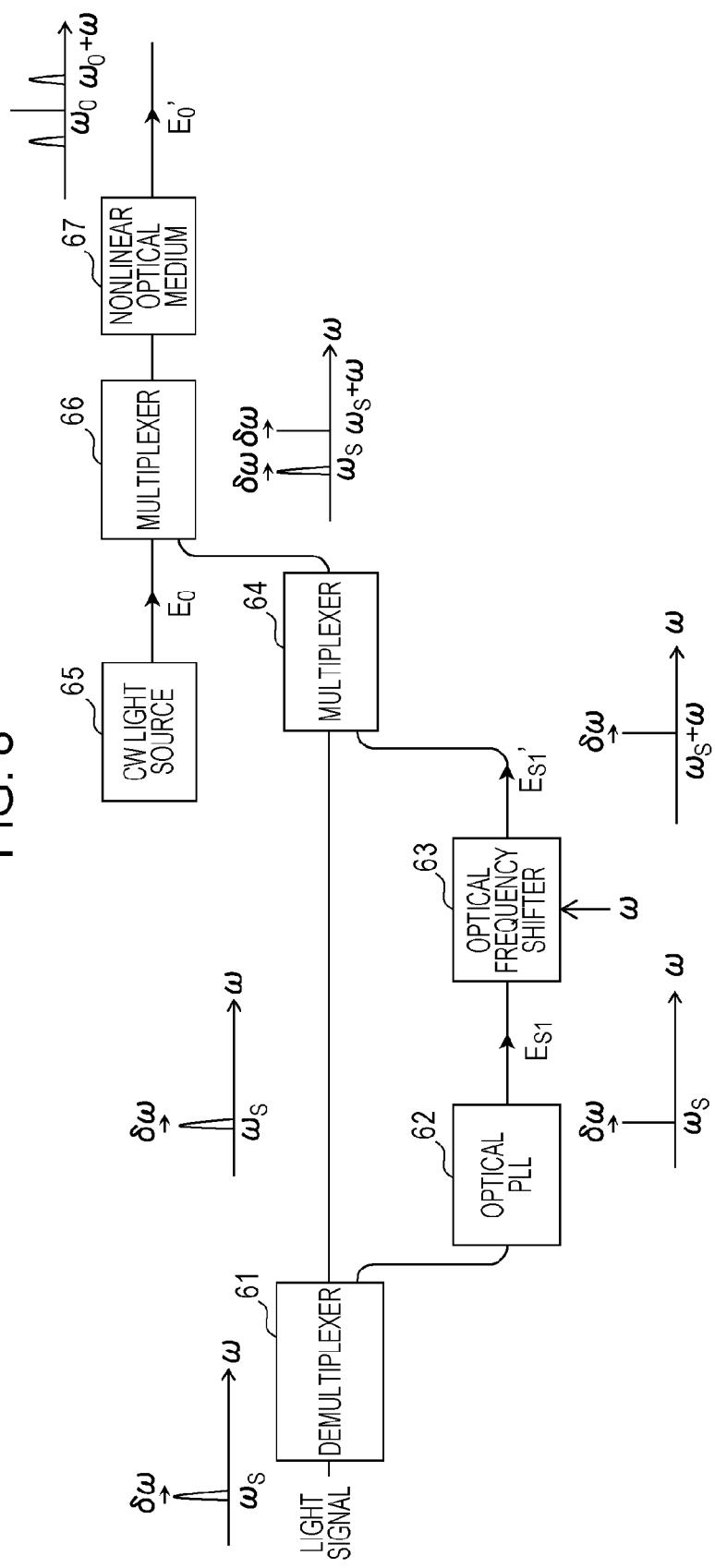
FIG. 8 is a block diagram of a frequency fluctuation suppressing device according to an embodiment.

FIG. 8 is a block diagram of a frequency fluctuation suppressing device according to an embodiment. The frequency fluctuation suppressing device is inserted in a transmission path or placed upstream of a light receiving device so that a frequency fluctuation added to an optical signal in the transmission path can be suppressed.

Referring to FIG. 8, the frequency fluctuation suppressing device includes a demultiplexer 61, an optical phase-locked loop (PLL) 62, an optical frequency shifter 63, a multiplexer 64, a CW light source 65, a multiplexer 66, and a nonlinear optical medium 67.

An optical signal at a frequency $\omega_S$ having a frequency fluctuation $\delta\omega$ is supplied from a transmission path to the demultiplexer 61. The demultiplexer 61 demultiplexes the supplied optical signal into a first optical signal and a second optical signal. The demultiplexer 61 supplies the first optical signal to the optical PLL 62, and supplies the second optical signal to the multiplexer 64. The optical PLL 62 generates CW light having a frequency $\omega_S$ that is optically phase-locked to the first optical signal. The CW light includes a frequency fluctuation $\delta\omega$. The CW light is supplied to the optical frequency shifter 63, is shifted by a frequency $\omega$, and is supplied as CW light having a frequency $\omega_S+\omega$ to the multiplexer 64. The multiplexer 64 multiplexes the optical signal having a frequency $\omega_S$ supplied from the transmission path with the CW light having a frequency $\omega_S+\omega$ to generate a phase-locked optical subcarrier modulation signal, and supplies the optical subcarrier modulation signal to the multiplexer 66.

Probe light $E_0$ having an optical frequency $\omega_0$, which is different from the frequency $\omega_S$ of the optical signal supplied from the transmission path, is supplied from the CW light source 65 to the multiplexer 66. The optical subcarrier modulation signal and the probe light $E_0$ are multiplexed by the multiplexer 66 and are supplied to the nonlinear optical medium 67. The multiplexer 64 and the multiplexer 66 may be integrated together.

The nonlinear optical medium 67 performs cross-phase modulation for the optical subcarrier modulation signal and the probe light $E_0$ to generate an optical signal $E_0'$ in which the frequency fluctuation $\delta\omega$ is suppressed, and outputs the generated optical signal $E_0'$. The optical signal $E_0'$ in which the frequency fluctuation $\delta\omega$ is suppressed may be converted to have a wavelength $(2\pi/\omega_S)$ of the original optical signal, and the converted optical signal may be output.

Figure 9:
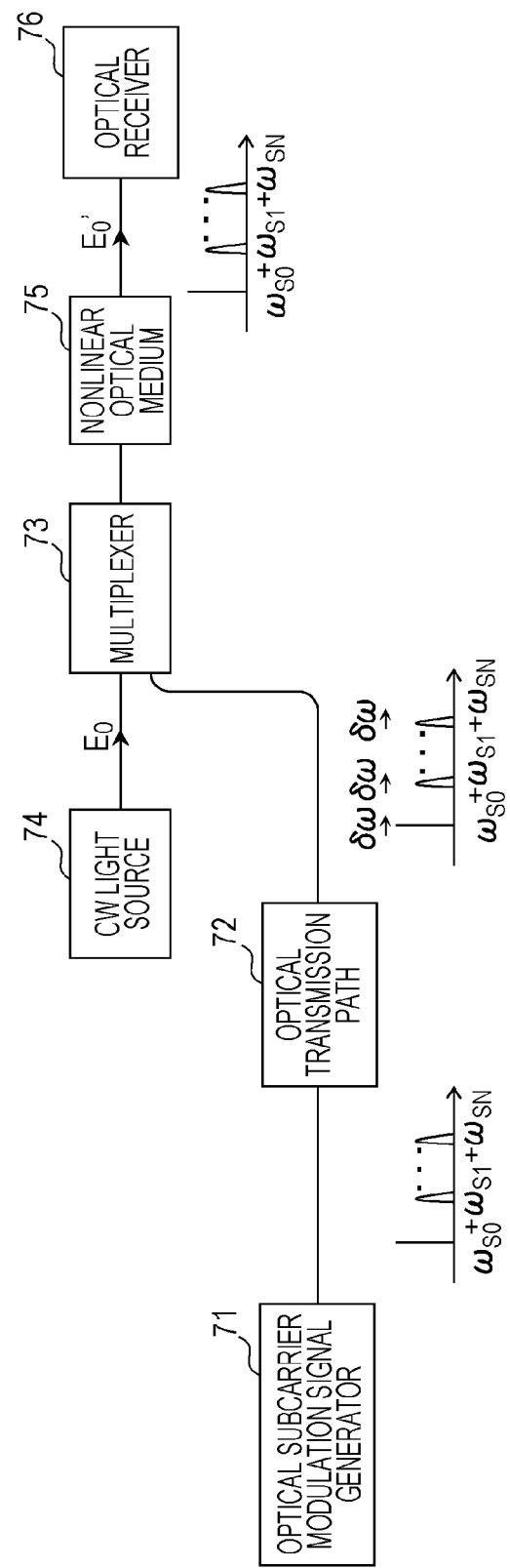
FIG. 9 is a block diagram of a frequency fluctuation suppressing system according to an embodiment.

FIG. 9 is a block diagram of a frequency fluctuation suppressing system according to an embodiment. The frequency fluctuation suppressing system suppresses, on the light receiving side, a frequency fluctuation generated in a transmission path. In the embodiment illustrated in FIG. 8, an optical subcarrier modulation signal is generated, on the receiving side, using the optical PLL 62, the optical frequency shifter 63, and the multiplexer 64. In the embodiment illustrated in FIG. 9, however, the transmission side generates an optical subcarrier modulation signal.

Referring to FIG. 9, the frequency fluctuation suppressing system includes an optical subcarrier modulation signal generator 71 on the light transmission side, an optical transmission path 72 that generates a frequency fluctuation, a multiplexer 73 on the light receiving side, a CW light source 74, a nonlinear optical medium 75, and a light receiver 76.

The optical subcarrier modulation signal generator 71 performs, using an electric subcarrier modulation signal, direct modulation using a laser diode or external modulation to generate an optical subcarrier modulation signal. The optical subcarrier modulation signal is obtained by performing data modulation of one or both of outputs from two CW light sources having a frequency spacing $\omega$, obtained by performing modulation, using different data, for all or part of the components of N-channel optical signals having frequencies $\omega_{S1}$ to $\omega_{SN}$ at a frequency spacing $\omega$, or obtained by multiplexing CW light at a certain frequency spacing with a plurality of data-modulated optical signals.

In FIG. 9, the optical subcarrier modulation signal generator 71 generates an optical subcarrier modulation signal obtained by multiplexing reference light having a frequency $\omega_{S0}$ with N-channel data-modulated optical signals having frequencies $\omega_{S1}$ to $\omega_{SN}$ at a frequency spacing $\omega$. A transmission optical signal, which is the optical subcarrier modulation signal, is supplied, via the optical transmission path 72, to the multiplexer 73 on the receiving side. By transmission through the optical transmission path 72, a frequency fluctuation $\delta\omega$ is generated in each of the reference light and the N-channel optical signal.

The multiplexer 73 multiplexes the optical subcarrier modulation signal with the probe light $E_0$ supplied from the CW light source 74. The probe light $E_0$ is CW light having an optical frequency $\omega_0$, which is different from the frequency of the optical subcarrier modulation signal. The multiplexer 73 supplies the multiplexed signal to the nonlinear optical medium 75. The nonlinear optical medium 75 performs cross-phase modulation for the optical subcarrier modulation signal and the probe light $E_0$ to generate an optical signal $E_0'$ in which a frequency fluctuation is suppressed, and supplies the generated optical signal $E_0'$ to the light receiver 76. The optical signal $E_0'$ in which a frequency fluctuation $\delta\omega$ is suppressed may be transmitted again to the optical transmission path.

Additional notes for the embodiments.

Note 1. An optical signal transmitting device, comprising: a plurality of direct modulators configured to be driven using electric signals of a plurality of channels to generate directly-modulated optical signals of a plurality of channels; a first multiplexer configured to multiplex the directly-modulated optical signals of the plurality of channels from the plurality of direct modulators; a subcarrier converter configured to modulate, using beat light at a specific frequency spacing, a multiplexed directly-modulated optical signal of the plurality of channels to generate an optical subcarrier modulation signal of a plurality of channels; a demultiplexer configured to demultiplex, for individual channels, the optical subcarrier modulation signal of the plurality of channels; a plurality of probe light sources configured to generate probe light of a plurality of channels having frequencies that are different from frequencies of the directly-modulated optical signals of the plurality of channels; a plurality of second multiplexers configured to multiplex, for individual channels, the optical subcarrier modulation signals of the plurality of channels with the probe light of the plurality of channels; and a plurality of nonlinear optical media configured to perform, for individual channels, optical cross phase modulation for the optical subcarrier modulation signals and the probe light, which are multiplexed, and transmit processed signals.

Note 2. An optical signal transmitting device, comprising: a plurality of direct modulators configured to be driven using electric signals of a plurality of channels to generate directly-modulated optical signals of a plurality of channels; a plurality of subcarrier converters configured to modulate, using beat light at specific frequency spacings, the directly-modulated optical signals of the plurality of channels from the plurality of direct modulators to generate optical subcarrier modulation signals of a plurality of channels; a probe light source configured to generate probe light of a single channel having a frequency that is different from frequencies of the directly-modulated optical signals of the plurality of channels; a plurality of multiplexers configured to sequentially multiplex, for individual channels, the optical subcarrier modulation signals of the plurality of channels with the probe light of the single channel; and a plurality of nonlinear optical media configured to perform, for individual channels, optical cross modulation for the optical subcarrier modulation signals and the probe light, which are multiplexed, and supply processed signals to individual multiplexers in a next stage or transmit the processed signals.

Note 3. An optical signal transmitting device, comprising: a plurality of direct modulators configured to be driven using electric signals of a plurality of channels to generate directly-modulated optical signals of a plurality of channels; a plurality of subcarrier converters configured to modulate, using beat light at specific frequency spacings, the directly-modulated optical signals of the plurality of channels from the plurality of direct modulators to generate optical subcarrier modulation signals of a plurality of channels; a probe light source configured to generate probe light of a single channel having a frequency that is different from frequencies of the directly-modulated optical signals of the plurality of channels; a multiplexer configured to multiplex the optical subcarrier modulation signals of the plurality of channels with the probe light of the single channel; and a nonlinear optical medium configured to perform optical cross modulation for the optical subcarrier modulation signals of the plurality of channels and the probe light of the single channel, which are multiplexed, and transmit a processed signal.

Note 4. An optical signal transmitting device, comprising: a plurality of direct modulators configured to be driven using electric signals of a plurality of channels to generate directly-modulated optical signals of a plurality of channels; a beat light source configured to generate beat light at a specific frequency spacing; a plurality of subcarrier converters configured to modulate, using the beat light from the beat light source, the directly-modulated optical signals of the plurality of channels from the plurality of direct modulators to generate optical subcarrier modulation signals of a plurality of channels; probe light sources configured to generate probe light of a plurality of channels having frequencies that are different from frequencies of the directly-modulated optical signals of the plurality of channels; a plurality of multiplexers configured to multiplex, for individual channels, the optical subcarrier modulation signals of the plurality of channels with the probe light of the plurality of channels; and a plurality of nonlinear optical media configured to perform, for individual channels, optical cross modulation for the optical subcarrier modulation signals and the probe light, which are multiplexed, and transmit processed signals.

Note 5. The optical signal transmitting device according to any one of notes 1 to 4, wherein the subcarrier converter includes a beat light source configured to generate beat light at the specific frequency spacing; a multiplexer configured to multiplex a supplied directly-modulated optical signal or a multiplexed directly-modulated optical signal with the beat light; a nonlinear optical medium configured to perform optical cross modulation for the directly-modulated optical signal multiplexed by the multiplexer or a multiplexed directly-modulated optical signal with the beat light to generate an optical subcarrier modulation signal; and an optical filter configured to extract zeroth-order and first-order modulation components from the optical subcarrier modulation signal.

Note 6. The optical signal transmitting device according to note 5, wherein a dispersion medium is used instead of the optical filter.

Note 7. The optical signal transmitting device according to any one of notes 1 to 4, wherein the subcarrier converter includes an oscillator configured to generate an electric signal having the specific frequency spacing as an oscillation frequency; an electrical-optical modulator configured to modulate, using the electric signal, a supplied directly-modulated optical signal or a multiplexed directly-modulated optical signal to generate an optical subcarrier modulation signal; and an optical filter configured to extract zeroth-order and first-order modulation components from the optical subcarrier modulation signal.

Note 8. The optical signal transmitting device according to note 7, wherein a dispersion medium is used instead of the optical filter.

Note 9. An optical signal transmitting method, comprising: driving, using electric signals of a plurality of channels, a plurality of direct modulators to generate directly-modulated optical signals of a plurality of channels; multiplexing the directly-modulated optical signals of the plurality of channels; modulating, using beat light at a specific frequency spacing, a multiplexed directly-modulated optical signal of the plurality of channels to generate an optical subcarrier modulation signal of a plurality of channels; demultiplexing, for individual channels, the optical subcarrier modulation signal of the plurality of channels; generating probe light of a plurality of channels having frequencies that are different from frequencies of the directly-modulated optical signals of the plurality of channels; multiplexing, for individual channels, the optical subcarrier modulation signals of the plurality of channels with the probe light of the plurality of channels; and performing, for individual channels, optical cross modulation for the optical subcarrier modulation signals and the probe light, which are multiplexed, and transmitting processed signals.

Note 10. An optical signal transmitting method, comprising: driving, using electric signals of a plurality of channels, a plurality of direct modulators to generate directly-modulated optical signals of a plurality of channels; modulating, using beat light at specific frequency spacings, the directly-modulated optical signals of the plurality of channels to generate optical subcarrier modulation signals of a plurality of channels; generating probe light of a single channel having a frequency that is different from frequencies of the directly-modulated optical signals of the plurality of channels; sequentially multiplexing, for individual channels, the optical subcarrier modulation signals of the plurality of channels with the probe light of the single channel; and performing, for individual channels, optical cross modulation for the optical subcarrier modulation signals and the probe light, which are multiplexed, and supplying processed signals to individual multiplexers in a next stage or transmitting the processed signals.

Note 11. An optical signal transmitting method, comprising: driving, using electric signals of a plurality of channels, a plurality of direct modulators to generate directly-modulated optical signals of a plurality of channels; modulating, using beat light at specific frequency spacings, the directly-modulated optical signals of the plurality of channels to generate optical subcarrier modulation signals of a plurality of channels; generating probe light of a single channel having a frequency that is different from frequencies of the directly-modulated optical signals of the plurality of channels; multiplexing the optical subcarrier modulation signals of the plurality of channels with the probe light of the single channel; and performing optical cross modulation for the optical subcarrier modulation signals of the plurality of channels and the probe light of the single channel, which are multiplexed, and transmitting a processed signal.

Note 12. An optical signal transmitting method, comprising: driving, using electric signals of a plurality of channels, a plurality of direct modulators to generate directly-modulated optical signals of a plurality of channels; generating beat light at a specific frequency spacing; modulating, using the beat light, the directly-modulated optical signals of the plurality of channels to generate optical subcarrier modulation signals of a plurality of channels; generating probe light of a plurality of channels having frequencies that are different from frequencies of the directly-modulated optical signals of the plurality of channels; multiplexing, for individual channels, the optical subcarrier modulation signals of the plurality of channels with the probe light of the plurality of channels; and performing, for individual channels, optical cross modulation for the optical subcarrier modulation signals and the probe light, which are multiplexed, and transmitting processed signals.

Note 13. A frequency fluctuation suppressing device, comprising: a demultiplexer configured to split an optical signal having a frequency fluctuation into a first optical signal and a second optical signal; an optical phase-locked loop configured to generate continuous wave light that is optically phase-locked to the first optical signal obtained by the demultiplexer; an optical frequency shifter configured to shift an optical frequency of the continuous wave light; a probe light source configured to generate probe light of a single channel having a frequency that is different from a frequency of the optical signal having the frequency fluctuation; a multiplexer configured to multiplex the second optical signal obtained by the demultiplexer with the continuous wave light from the optical frequency shifter to generate an optical subcarrier modulation signal and then multiplex the optical subcarrier modulation signal with the probe light; and a nonlinear optical medium configured to perform optical cross modulation for the optical subcarrier modulation signal and the probe light of the single channel, which are multiplexed, and output a processed signal.

Note 14. A frequency fluctuation suppressing system, comprising: an optical subcarrier modulation signal transmitter and generator configured to generate, on a light transmitting side, an optical subcarrier modulation signal including reference light and a data-modulated optical signal and optically transmit the generated optical subcarrier modulation signal; a probe light source configured to generate, on a light receiving side, probe light of a single channel having a frequency that is different from a frequency of the optical subcarrier modulation signal; a multiplexer configured to multiplex, on the light receiving side, the optical subcarrier modulation signal, which is received from an optical transmission path, with the probe light; and a nonlinear optical medium configured to perform optical cross modulation for the optical subcarrier modulation signal and the probe light of the single channel, which are multiplexed, and output a processed signal.

Note 15. An optical signal transmitting device, comprising: an optical modulator configured to be driven using a driving signal multiplying an electric signal by a subcarrier signal; a probe light source configured to generate probe light; a multiplexer configured to multiplex the modulated signal output from the optical modulator with the probe light; and a nonlinear optical medium configured to perform optical cross phase modulation for the modulated signal and the probe light, which are multiplexed, and transmit a processed signal.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical signal transmitting device, comprising:
    a plurality of direct modulators configured to be driven using electric signals of a plurality of channels to generate directly-modulated optical signals of a plurality of channels;
    a beat light source configured to generate beat light at a specific frequency spacing;
    a plurality of subcarrier converters configured to modulate, using the beat light from the beat light source, the directly-modulated optical signals of the plurality of channels from the plurality of direct modulators to generate optical subcarrier modulation signals of a plurality of channels;
    probe light sources configured to generate probe light of a plurality of channels having frequencies that are different from frequencies of the directly-modulated optical signals of the plurality of channels;
    a plurality of multiplexers configured to multiplex, for individual channels, the optical subcarrier modulation signals of the plurality of channels with the probe light of the plurality of channels; and
    a plurality of nonlinear optical media configured to perform, for individual channels, optical cross modulation for the optical subcarrier modulation signals and the probe light, which are multiplexed, and transmit processed signals.

2. The optical signal transmitting device according to claim 1,
    wherein the subcarrier converter includes
    a beat light source configured to generate beat light at the specific frequency spacing;
    a multiplexer configured to multiplex a supplied directly-modulated optical signal or a multiplexed directly-modulated optical signal with the beat light;
    a nonlinear optical medium configured to perform optical cross modulation for the directly-modulated optical signal multiplexed by the multiplexer or a multiplexed directly-modulated optical signal with the beat light to generate an optical subcarrier modulation signal; and
    an optical filter configured to extract zeroth-order and first-order modulation components from the optical subcarrier modulation signal.

3. The optical signal transmitting device according to claim 2,
    wherein a dispersion medium is used instead of the optical filter.

4. The optical signal transmitting device according to claim 1,
    wherein the subcarrier converter includes
    an oscillator configured to generate an electric signal having the specific frequency spacing as an oscillation frequency;
    an electrical-optical modulator configured to modulate, using the electric signal, a supplied directly-modulated optical signal or a multiplexed directly-modulated optical signal to generate an optical subcarrier modulation signal; and
    an optical filter configured to extract zeroth-order and first-order modulation components from the optical subcarrier modulation signal.

5. The optical signal transmitting device according to claim 4,
    wherein a dispersion medium is used instead of the optical filter.

6. An optical signal transmitting method, comprising:
    driving, using electric signals of a plurality of channels, a plurality of direct modulators to generate directly-modulated optical signals of a plurality of channels;
    generating beat light at a specific frequency spacing;
    modulating, using the beat light, the directly-modulated optical signals of the plurality of channels to generate optical subcarrier modulation signals of a plurality of channels;
    generating probe light of a plurality of channels having frequencies that are different from frequencies of the directly-modulated optical signals of the plurality of channels;
    multiplexing, for individual channels, the optical subcarrier modulation signals of the plurality of channels with the probe light of the plurality of channels; and
    performing, for individual channels, optical cross modulation for the optical subcarrier modulation signals and the probe light, which are multiplexed, and transmitting processed signals.

7. An optical signal transmitting device, comprising:
    an optical modulator configured to be driven using a driving signal multiplying an electric signal by a subcarrier signal;
    a probe light source configured to generate probe light;
    a multiplexer configured to multiplex the modulated signal output from the optical modulator with the probe light; and
    a nonlinear optical medium configured to perform optical cross phase modulation for the modulated signal and the probe light, which are multiplexed, and transmit a processed signal.

8. The optical signal transmitting device according to claim 1, wherein the beat light has a plurality of wavelengths at the specific frequency spacing.

* * * * *